(12) United States Patent
Chu et al.

(10) Patent No.: US 12,279,451 B2
(45) Date of Patent: Apr. 15, 2025

(54) SEMICONDUCTOR DEVICE INCLUDING SOURCE/DRAIN FEATURE WITH MULTIPLE EPITAXIAL LAYERS

(71) Applicant: Taiwan Semiconductor Manufacturing Co., Ltd., Hsinchu (TW)

(72) Inventors: Feng-Ching Chu, Hsinchu (TW); Chung-Chi Wen, Hsinchu (TW); Chia-Pin Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 674 days.

(21) Appl. No.: 17/321,996

(22) Filed: May 17, 2021

(65) Prior Publication Data

US 2022/0069135 A1    Mar. 3, 2022

Related U.S. Application Data

(60) Provisional application No. 63/072,455, filed on Aug. 31, 2020.

(51) Int. Cl.
*H01L 21/02* (2006.01)
*H10D 30/01* (2025.01)
(Continued)

(52) U.S. Cl.
CPC ..... *H10D 30/797* (2025.01); *H01L 21/02532* (2013.01); *H01L 21/0259* (2013.01);
(Continued)

(58) Field of Classification Search
CPC ......... H01L 29/78618; H01L 21/02532; H01L 29/0665; H01L 29/7848; H01L 29/66818;
(Continued)

(56) References Cited

U.S. PATENT DOCUMENTS

| | | | |
|---|---|---|---|
| 9,818,872 | B2 | 11/2017 | Ching et al. |
| 9,887,269 | B2 | 2/2018 | Ching et al. |
| 9,899,398 | B1 | 2/2018 | Colinge |
| 10,032,627 | B2 | 7/2018 | Lee et al. |
| 10,109,721 | B2 | 10/2018 | Lin et al. |

(Continued)

FOREIGN PATENT DOCUMENTS

| | | |
|---|---|---|
| KR | 20170032840 A | 3/2017 |
| KR | 20180113118 A | 10/2018 |
| KR | 20200036733 A | 4/2020 |

*Primary Examiner* — Cheung Lee
(74) *Attorney, Agent, or Firm* — HAYNES AND BOONE, LLP

(57) ABSTRACT

The present disclosure provides a semiconductor device and a method of forming the same. A semiconductor device according one embodiment of the present disclosure include a plurality of channel members disposed over a substrate, a plurality of inner spacer features interleaving the plurality of channel members, a gate structure wrapping around each of the plurality of channel members, and a source/drain feature. The source/drain feature includes a first epitaxial layer in contact with the substrate and the plurality of channel members, and a second epitaxial layer in contact with the first epitaxial layer and the plurality of inner spacer features. The first epitaxial layer and the second epitaxial layer include silicon germanium. A germanium content of the second epitaxial layer is greater than a germanium content of the first epitaxial layer.

20 Claims, 27 Drawing Sheets

(51) Int. Cl.
*H10D 30/67* (2025.01)
*H10D 30/69* (2025.01)
*H10D 62/00* (2025.01)
*H10D 62/10* (2025.01)
*H10D 62/832* (2025.01)
*H10D 64/01* (2025.01)

(52) U.S. Cl.
CPC ....... *H10D 30/031* (2025.01); *H10D 30/6713* (2025.01); *H10D 30/6735* (2025.01); *H10D 30/6757* (2025.01); *H10D 62/021* (2025.01); *H10D 62/118* (2025.01); *H10D 62/832* (2025.01); *H10D 64/017* (2025.01); *H10D 64/018* (2025.01)

(58) Field of Classification Search
CPC ............ H01L 21/0259; H10D 30/0273; H10D 30/031; H10D 30/6713; H10D 30/501–509; H10D 30/6735; H10D 30/674; H10D 30/6757; H10D 30/797; H10D 62/021; H10D 62/118; H10D 62/83; H10D 62/832; H10D 64/017; H10D 64/018
See application file for complete search history.

(56) References Cited

U.S. PATENT DOCUMENTS

| | | | |
|---|---|---|---|
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 2016/0087104 A1* | 3/2016 | Lee | H01L 29/66795 257/192 |
| 2017/0077244 A1 | 3/2017 | Chang | |
| 2018/0175036 A1 | 6/2018 | Ching et al. | |
| 2018/0294331 A1 | 10/2018 | Cho | |
| 2019/0067490 A1* | 2/2019 | Yang | H01L 29/1033 |
| 2019/0348541 A1* | 11/2019 | Moroz | H01L 21/30604 |
| 2020/0044087 A1 | 2/2020 | Guha et al. | |
| 2020/0075743 A1 | 3/2020 | Lee et al. | |
| 2020/0105934 A1 | 4/2020 | Ma | |
| 2020/0168742 A1 | 5/2020 | Wang et al. | |
| 2020/0220018 A1* | 7/2020 | Jang | H01L 29/0847 |
| 2020/0266060 A1* | 8/2020 | Cheng | H01L 29/0673 |
| 2020/0365692 A1* | 11/2020 | Jung | H01L 29/0673 |
| 2020/0365733 A1* | 11/2020 | Song | H01L 29/0847 |
| 2020/0373402 A1* | 11/2020 | Yang | H01L 21/823878 |
| 2020/0395445 A1* | 12/2020 | Choi | H01L 29/78696 |
| 2021/0408283 A1* | 12/2021 | Agrawal | H01L 29/42392 |

* cited by examiner

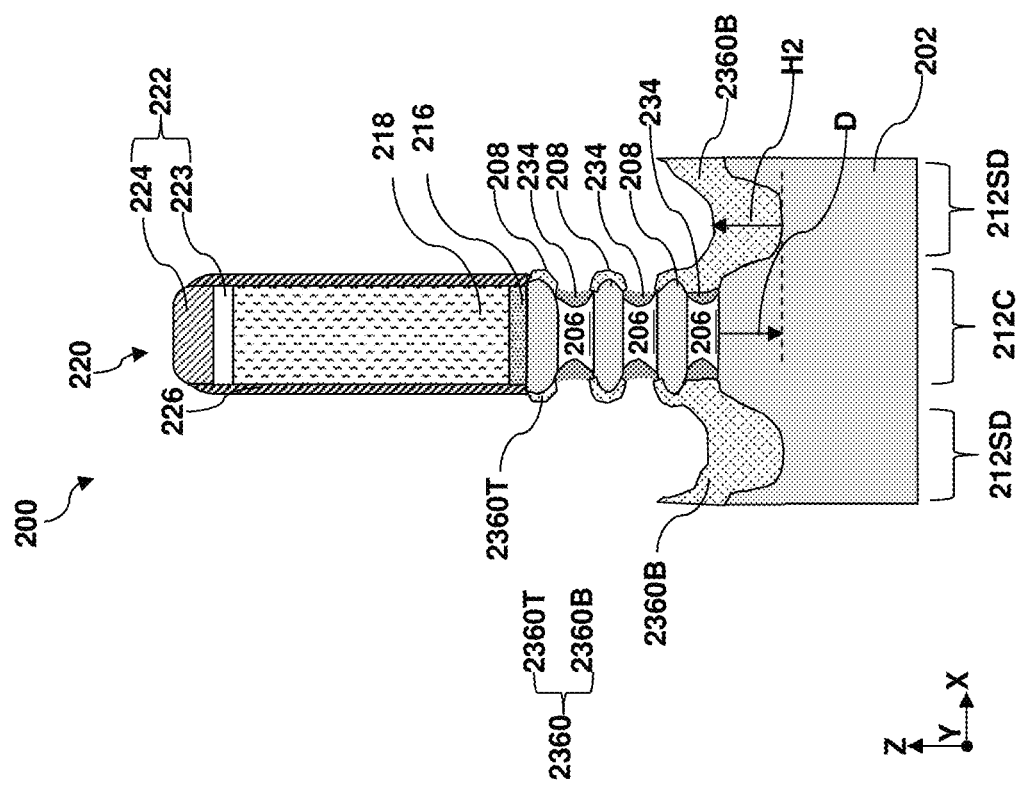

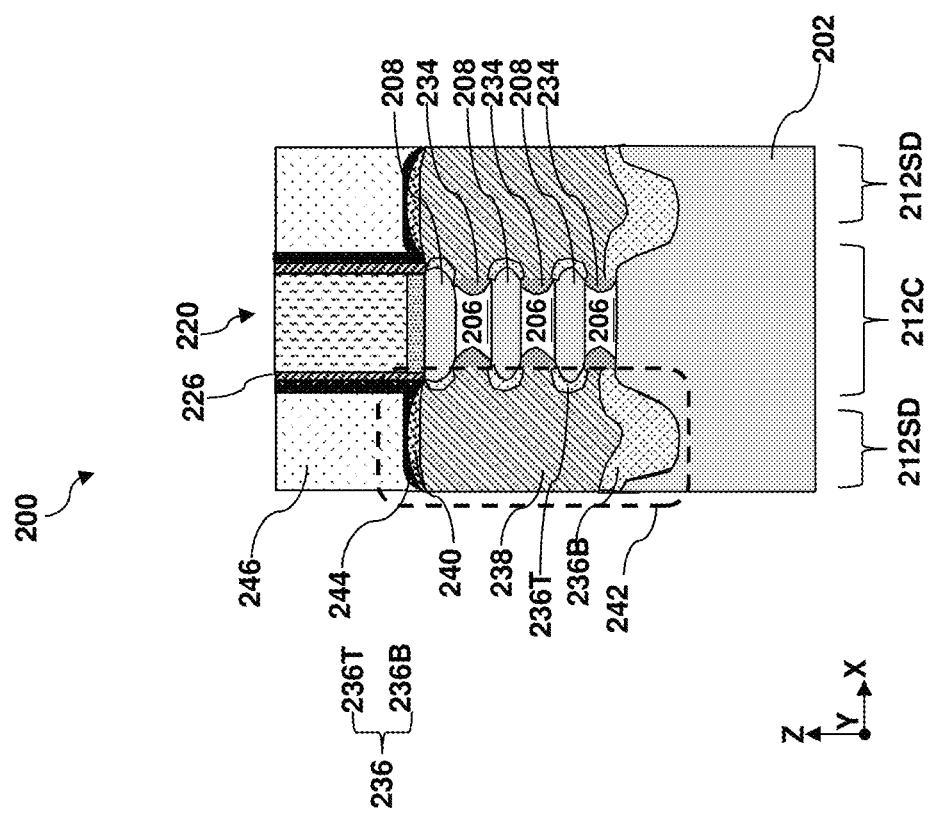

SEMICONDUCTOR DEVICE INCLUDING SOURCE/DRAIN FEATURE WITH MULTIPLE EPITAXIAL LAYERS

PRIORITY DATA

This application claims priority to U.S. Provisional Patent Application No. 63/072,455, filed on Aug. 31, 2020, entitled "Epitaxial Features", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

To improve performance of an MBC transistor, efforts are invested to develop epitaxial features that strain channels and provide reduced resistance. While conventional epitaxial features are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-11, 12A-19A, and 12B-19B illustrate fragmentary cross-sectional views of a workpiece during a fabrication process according to the method of FIG. 1, according to one or more aspects of the present disclosure.

DETAILED DESCRIPTION

Figure 1:
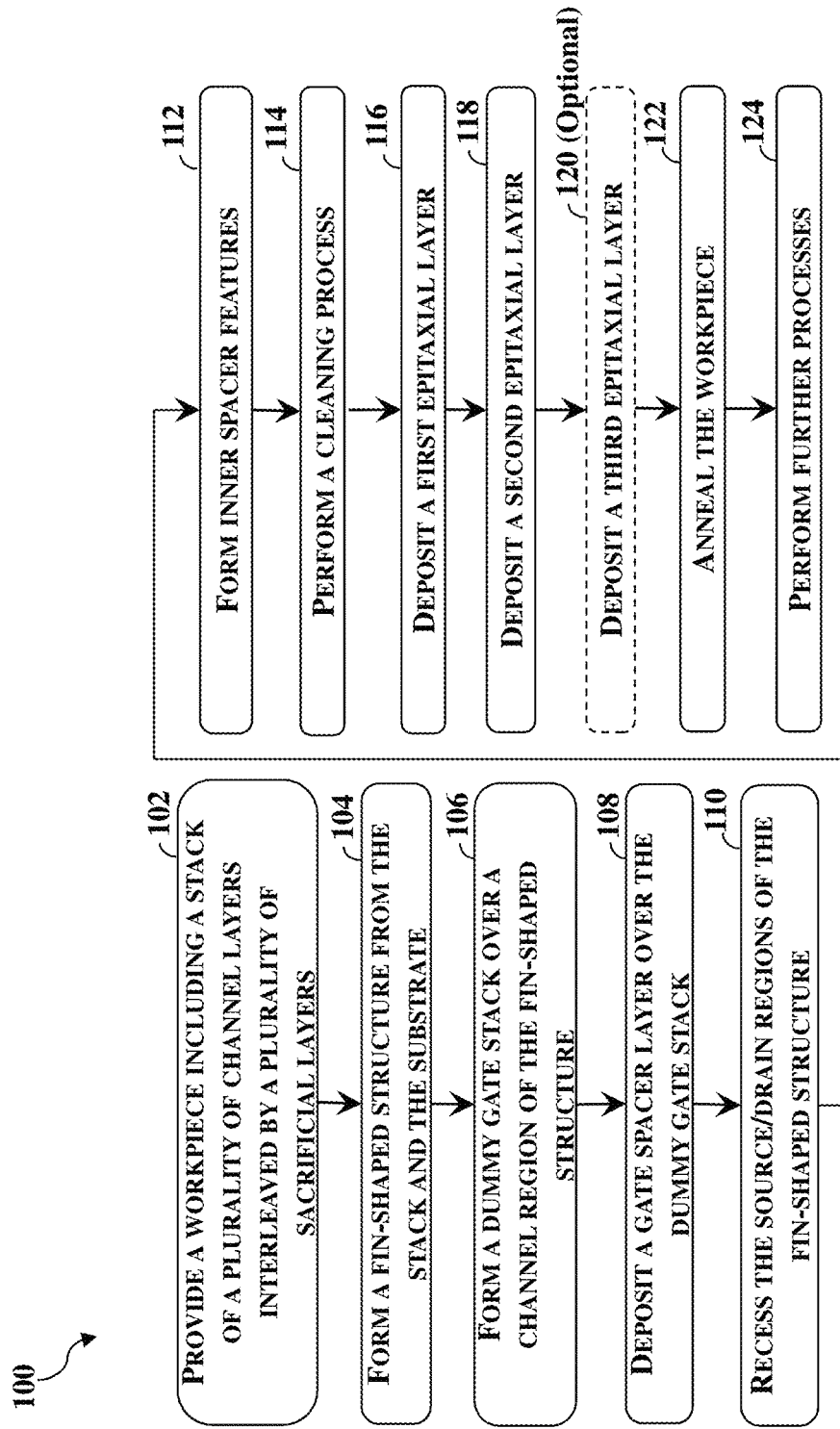
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to multilayer epitaxial features of MBC transistors. Channel regions of an MBC transistor may be disposed in nanowire channel members, bar-shaped channel members, nanosheet channel members, nanostructure channel members, column-shaped channel members, post-shaped channel members, and/or other suitable channel configurations. Depending on the shapes of the channel members, MBC transistors may also be referred to as nanowire transistors or nanosheet transistors. Despite of the shapes, each of the channel members of an MBC transistor extend between and are coupled to two source/drain features. Ideal source/drain features of an MBC transistor introduce strain on the channel members and provide low resistance. While the germanium content in the source/drain feature may be increased to enhance the strain on the channel members, a greater germanium content may lead to more defects at the interface between the source/drain feature and the channel members. Similarly, while a doping concentration in the source/drain feature may be increased to lower the resistance, a greater dopant concentration may lead to more defects at the interface between the source/drain feature and the channel members. The defects at the interface may increase contact resistance.

The present disclosure provides embodiments of a semiconductor device where its source/drain feature includes a first epitaxial layer to interface a channel member and a second epitaxial layer spaced apart from the channel member. The first epitaxial layer serves as a transition layer to interface the channel member and to reduce interfacial defects. The second epitaxial layer may have a doping concentration greater than that of the first epitaxial layer to lower resistance. At the same time, the second epitaxial layer may have a greater germanium content to improve the strain on the channel member. To improve the strain on the channel member and to lower the resistance, the first epitaxial layer is minimized and the second epitaxial layer is maximized, provided that the first epitaxial layer completely covers the exposed channel members. In some embodiments, the first epitaxial layer includes a channel sidewall portion and a substrate portion and the substrate portion is formed to a thickness where the substrate portion merges with one or more lower channel sidewall portions. Each of the channel members has a rounded sidewall profile and each of the channel sidewall portions wraps over the rounded sidewall.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIGS. 2-11, 12A-19A, and 12B-19B, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 as the context requires. For avoidance, the X, Y and Z directions in FIGS. 2-11, 12A-19A, and 12B-19B are perpendicular to one another. Throughout the present disclosure, like reference numerals denote like features, unless otherwise excepted.

Figure 2:
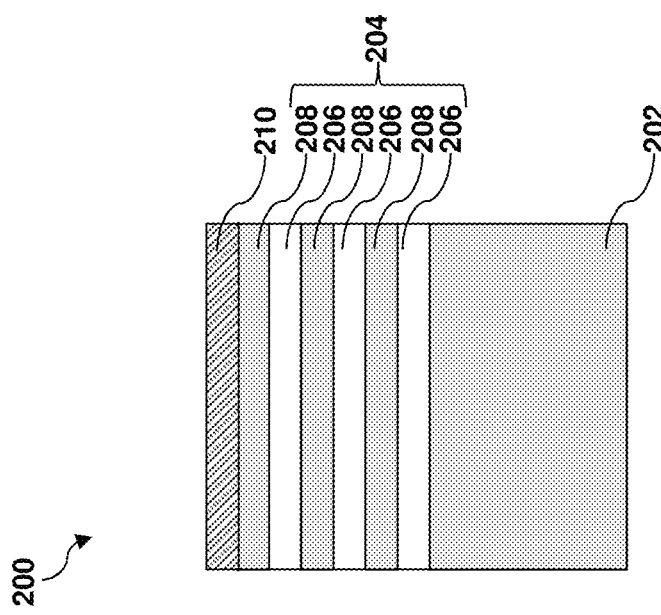

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenic (As). In embodiments where the semiconductor device is n-type, a p-type doping profile (i.e., a p-type well or p-well) may be formed on the substrate 202. In some implementations, the n-type dopant for forming the p-type well may include boron (B) or gallium (Ga). The suitable doping may include ion implantation of dopants and/or diffusion processes. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. The first and second semiconductor composition may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness between about 9 nm and about 10 nm and all of the channel layers 208 may have a substantially uniform second thickness between about 6 nm and about 8 nm. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel region(s) for a subsequently-formed multi-gate device and the thickness of each of the sacrificial layers 206 is chosen based on device performance considerations.

The layers in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth processes for the stack 204.

Figure 3:
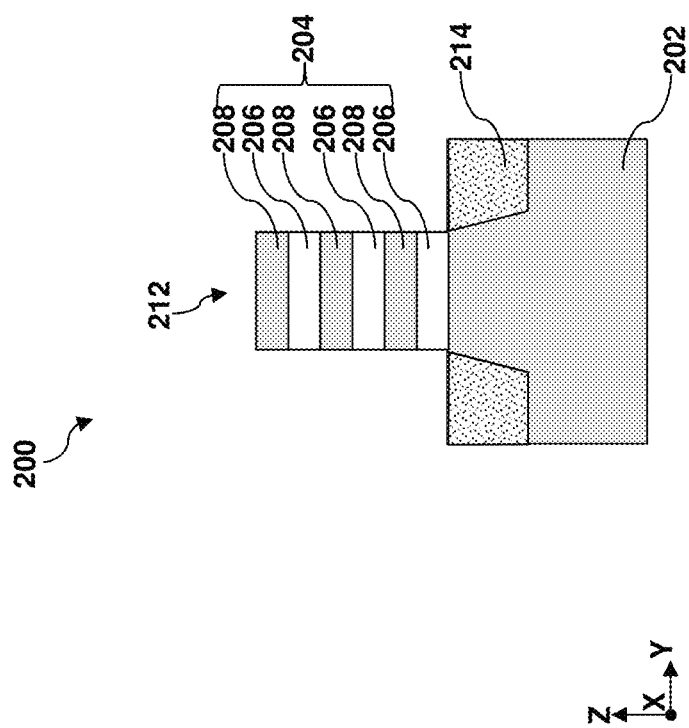

Referring still to FIGS. 1, 2 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212, along with the sacrificial layers 206 and the channel layers 208 therein, extends vertically along the Z direction and lengthwise along the X direction.

An isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing.

Figure 4:
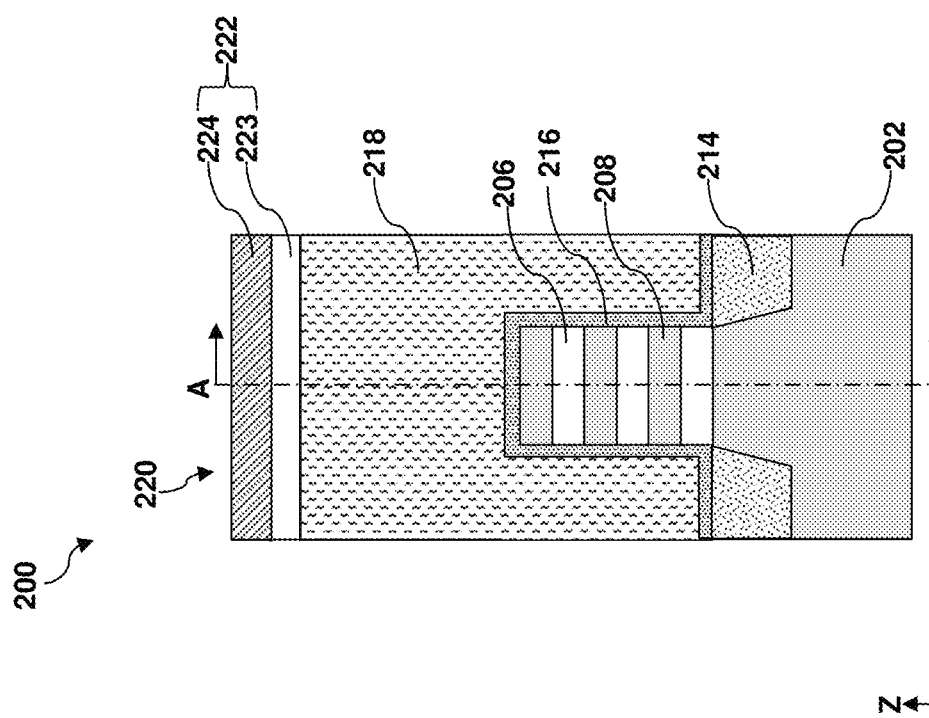
Figure 5:
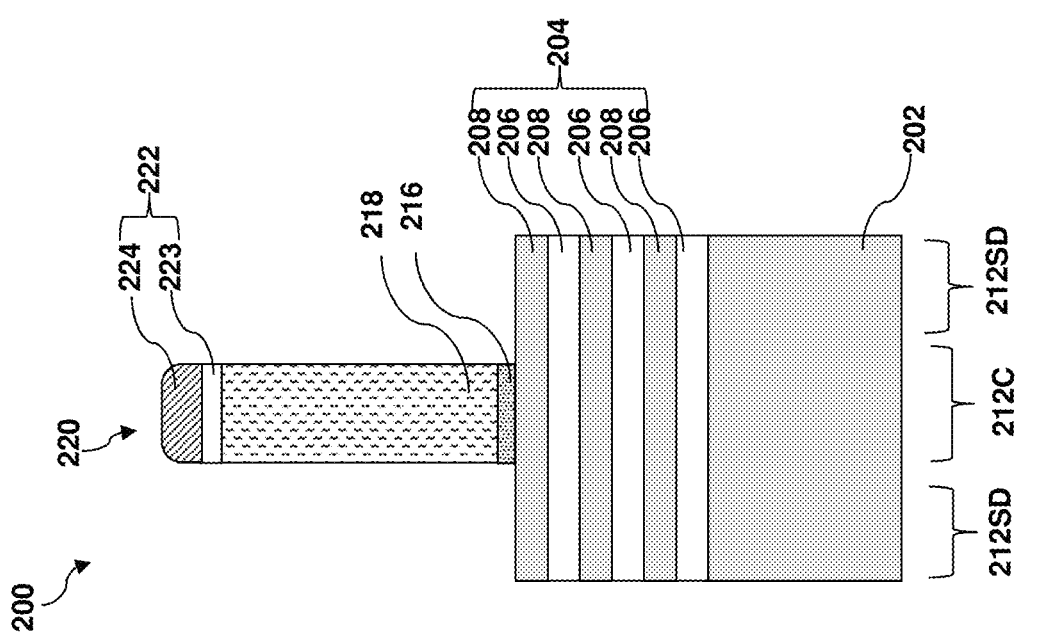

Referring to FIGS. 1, 4 and 5, method 100 includes a block 106 where a dummy gate stack 220 is formed over a channel region 212C of the fin-shaped structure 212. In some embodiments, a gate replacement process (or gate-last process) is adopted where the dummy gate stack 220 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 212 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, no dummy gate stack 220 is disposed over the source/drain region 212SD of the fin-shaped structure 212.

Figure 6:
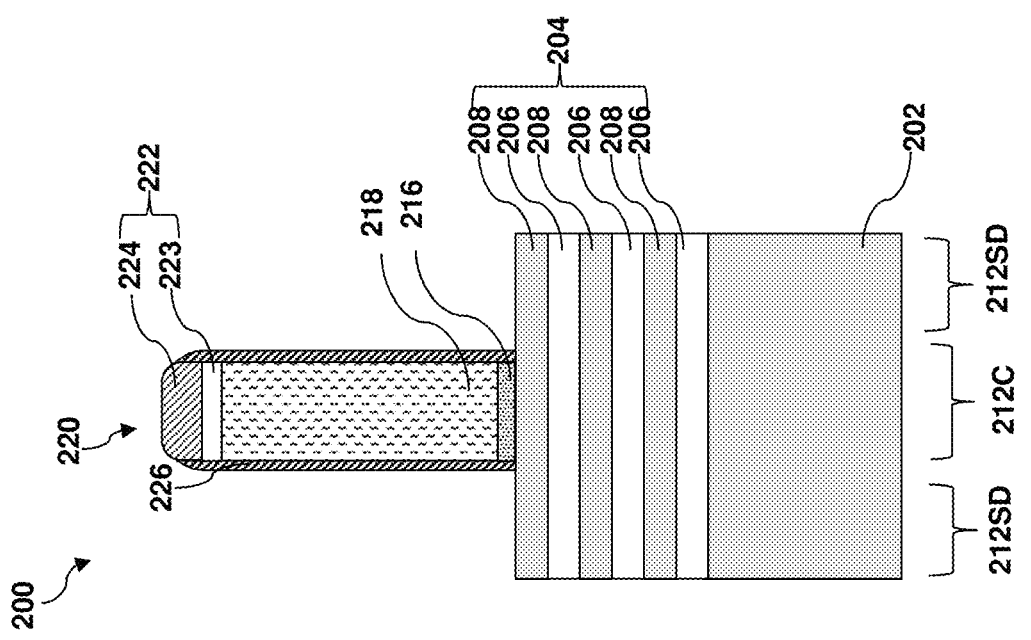

Referring to FIGS. 1 and 6, method 100 includes a block 108 where a gate spacer layer 226 is deposited over the dummy gate stack 220. In some embodiments, the gate spacer layer 226 is deposited conformally over the workpiece 200, including over top surfaces and sidewalls of the dummy gate stack 220. The term "conformally" may be used herein for ease of description of a layer having substantially uniform thickness over various regions. The gate spacer layer 226 may be a single layer or a multi-layer. The at least one layer in the gate spacer layer 226 may include silicon carbonitride, silicon oxycarbide, silicon oxycarbonitride, or silicon nitride. The gate spacer layer 226 may be deposited over the dummy gate stack 220 using processes such as, a CVD process, a subatmospheric CVD (SACVD) process, an ALD process, or other suitable process. In one embodiment, the gate spacer layer 226 includes a first layer, a second layer disposed over the first layer, and a third layer disposed over the second layer. The first layer and the second layer include silicon oxynitride and the third layer includes silicon nitride.

Figure 7:
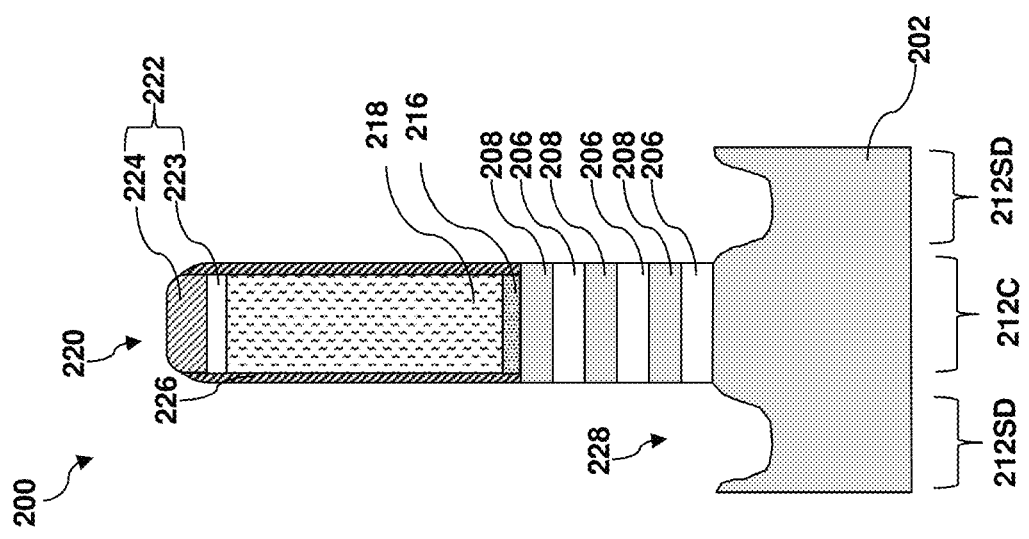
Figure 8:
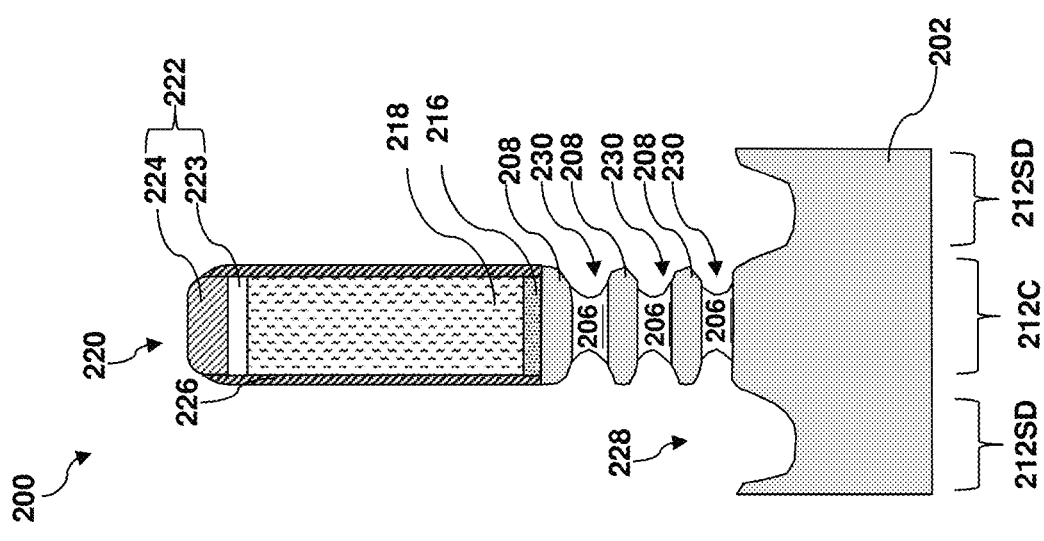

Referring to FIGS. 1 and 7, method 100 includes a block 110 where a source/drain region 212SD of the fin-shaped structure 212 is recessed to form a source/drain trench 228. In some embodiments, the source/drain regions 212SD that are not covered by the dummy gate stack 220 and the gate spacer layer 226 are etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or CHBR3), an iodine-containing gas, other suitable gases and/or plasmas, and/or combinations thereof. In some embodiments represented in FIG. 7, the source/drain regions 212SD of the fin-shaped structure 212 are recessed to expose sidewalls of the sacrificial layers 206 and the channel layers 208. In some implementations, the source/drain trenches 228 extend below the stack 204 into the substrate 202. FIG. 7 illustrates a cross-sectional view of the workpiece 200 viewed along the Y direction at the source/drain region 212SD. As shown in FIG. 7, the sacrificial layers 206 and channel layers 208 in the source/drain region 212SD are removed at block 110, exposing the substrate 202.

Referring to FIGS. 1, 8, 9, and 10, method 100 includes a block 112 where inner spacer features 234 are formed. While not shown explicitly, operation at block 112 may include selective and partial removal of the sacrificial layers 206 to form inner spacer recesses 230, deposition of inner spacer material 232 over the workpiece 200, and etch back the inner spacer material 232 to form inner spacer features 234 in the inner spacer recesses 230. The sacrificial layers 206 exposed in the source/drain trenches 228 (shown in FIG. 8) are selectively and partially recessed to form inner spacer recesses 230 while the gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. The selective and partial recess of the sacrificial layers 206 may include a SiGe oxidation process followed by a SiGe oxide removal. In that embodiments, the SiGe oxidation process may include use of ozone. In some other embodiments, the selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

Figure 9:
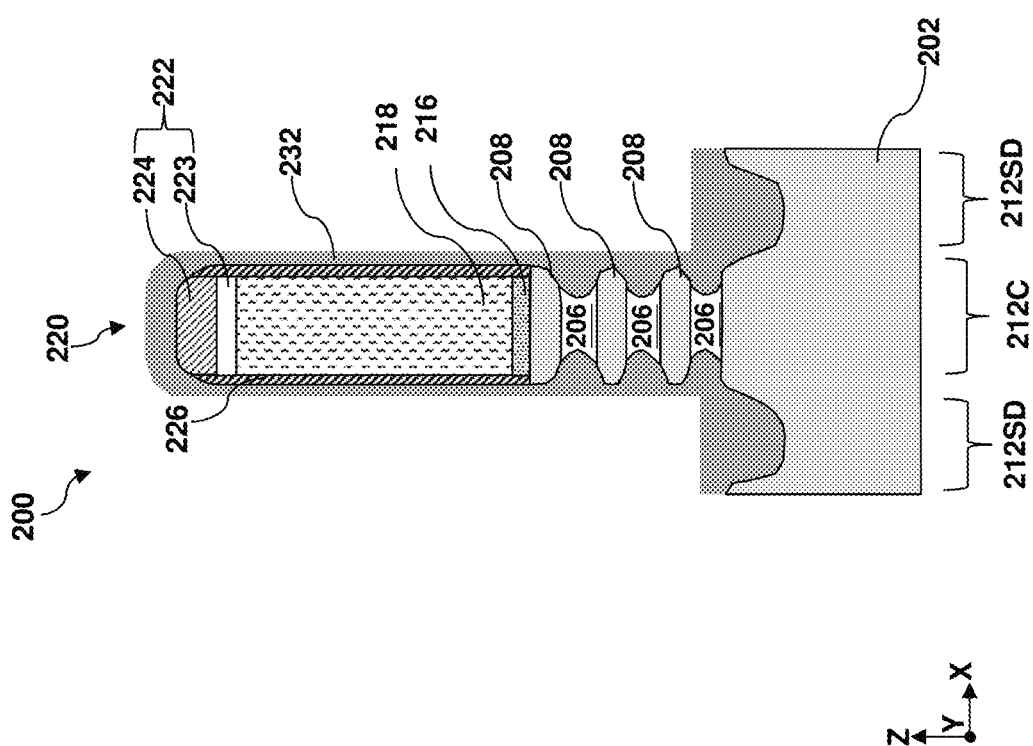
Figure 10:
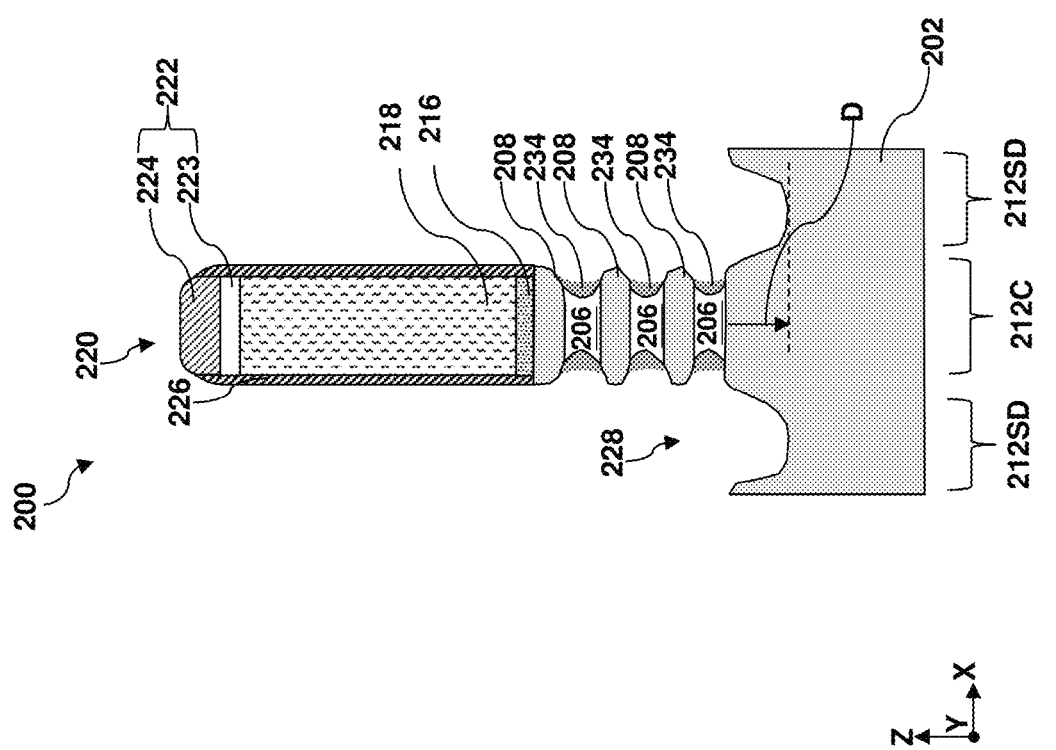

After the inner spacer recesses 230 are formed, the inner spacer material 232 is deposited over the workpiece 200, including over the inner spacer recesses 230, as shown in FIG. 9. The inner spacer material 232 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material 232 may be a single layer or a multilayer. In some implementations, the inner spacer material 232 may be deposited using CVD, PECVD, SACVD, ALD or other suitable methods. The inner spacer material 232 is deposited into the inner spacer recesses 230 as well as over the sidewalls of the channel layers 208 exposed in the source/drain trenches 228. Referring to FIG. 10, the deposited inner spacer material 232 is then etched back to remove the inner spacer material 232 from the sidewalls of the channel layers 208 to form the inner spacer features 234 in the inner spacer recesses 230. At block 112, the inner spacer material 232 may also be removed from the top surfaces and/or sidewalls of the gate-top hard mask layer 222 and the gate spacer layer 226. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 10, each of the inner spacer features 234 is in direct contact with the recessed sacrificial layers 206 and is disposed between two neighboring channel layers 208. In some instances, each of the inner spacer features 234 measures between about 3 nm and about 5 nm thick along the X direction. As shown in FIG. 10, while the selective etch process and etch back process at block 112 are selective to the sacrificial layers 206 and the inner spacer material 232, the channel layers 208 are moderately etched and have rounded ends. In the depicted embodiment, the source/drain trench 228 extends a depth D into the substrate 202 and the depth D is between about 10 nm and about 12 nm.

Figure 11:
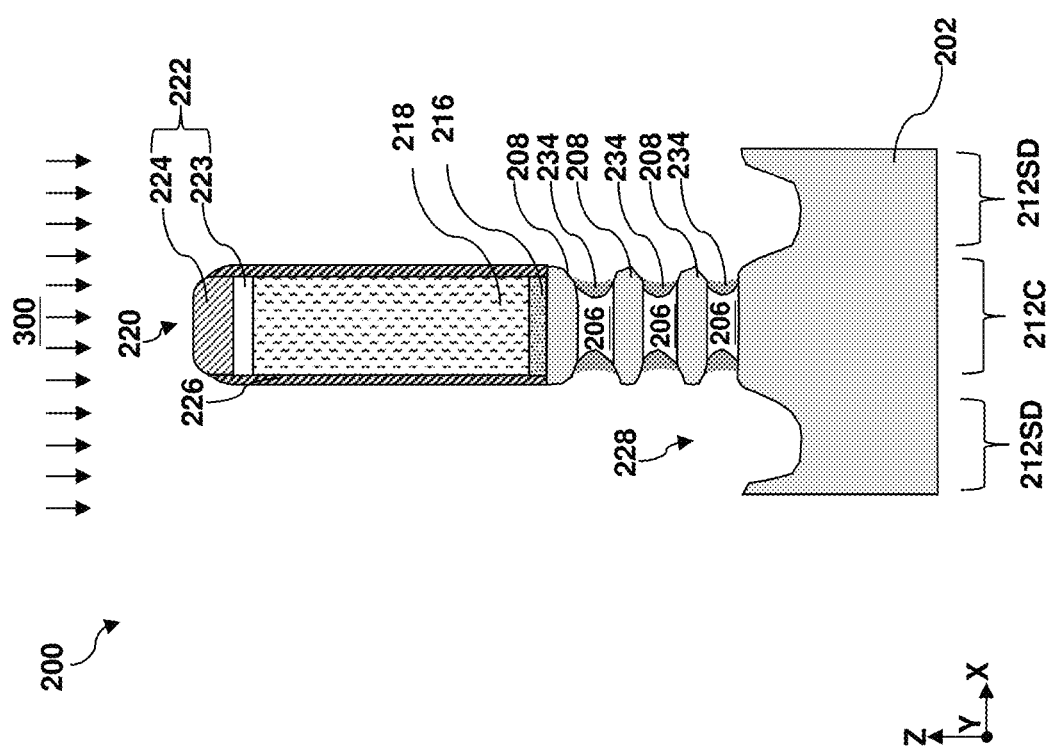

Referring to FIGS. 1 and 11, method 100 includes a block 114 where a cleaning process 300 is performed. The cleaning process 300 may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. The dry clean process may include helium (He) and hydrogen ($H_2$) treatment at a temperature between about 250° C. and about 550° C. and under a pressure between about 75 mTorr and about 155 mTorr. The hydrogen treatment may convert silicon on the surface to silane ($SiH_4$), which may be pumped out for removal. In some implementations, the cleaning process is configured to selectively remove or trim a portion of the channel layers without substantially removing the inner spacer features 234. The cleaning process 300 may remove surface oxide and debris in order to ensure a clean semiconductor surface, which facilitates growth of high quality epitaxial layers at block 116.

Figure 12A:
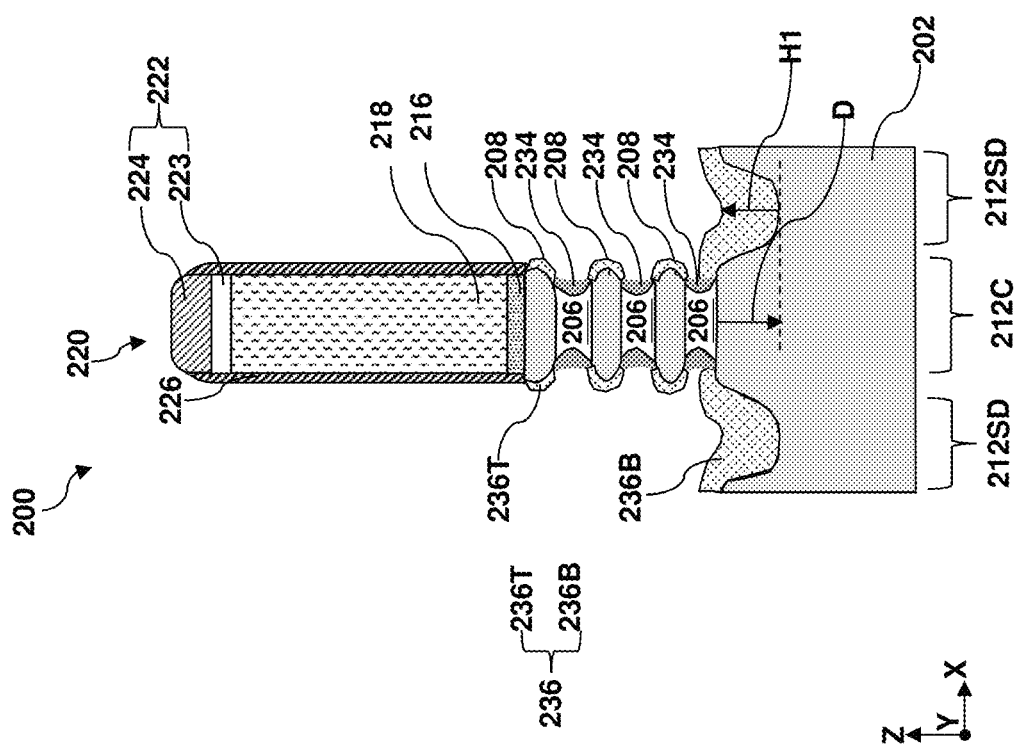

Referring to FIGS. 1, 12A and 12B, method 100 includes a block 116 where a first epitaxial layer 236 is deposited. In some implementations represented in FIG. 12A, the first epitaxial layer 236 may be epitaxially and selectively formed from the exposed sidewalls of the channel layers 208 and exposed surfaces of the substrate 202 while sidewalls of the sacrificial layers 206 remain covered by the inner spacer features 234. Suitable epitaxial processes for block 116 include vapor-phase epitaxy (VPE), ultra-high vacuum CVD (UHV-CVD), molecular beam epitaxy (MBE), and/or other suitable processes. The epitaxial growth process at block 116 may use gaseous precursors, which interact with the composition of the substrate 202 as well as the channel layers 208. In some embodiments, parameters of the epitaxial growth process at block 116 are selected such that the first epitaxial layer 236 is not epitaxially deposited on the inner spacer features 234. According to the present disclosure, upon conclusion of the operations at block 116, at least some inner spacer features 234 remain exposed. That is, at least some inner spacer features 234 are not completely covered by the first epitaxial layer 236. In some instances, the first epitaxial layer 236 includes silicon germanium (SiGe) and is doped with a p-type dopant, such as boron (B). In some embodiments, the first epitaxial layer 236 includes a germanium (Ge) content between about 20% and 30% and a silicon (Si) content between about 80% and about 70%. This germanium (Ge) content range is not trivial. When the germanium content is greater than about 30%, the lattice mismatch between silicon and germanium may cause too much defect at the interface between the first epitaxial layer 236 and the channel layers 208, which may lead to increased resistance or device failure. When the germanium content is smaller than about 20%, the channel layers 208 may not be sufficiently strained for improved hole mobility. A concentration of the p-type dopant in the first epitaxial layer 236 may be between about $1\times10^{20}$ atoms/cm$^3$ and about $4\times10^{20}$ atoms/cm$^3$. This p-type dopant concentration range is not trivial either. When the doping concentration of the p-type dopant in the first epitaxial layer 236 is lower than about $1\times10^{20}$ atoms/cm$^3$, the resistance in the first epitaxial feature layer 236 may prevent satisfactory drive current (i.e., On-state current). When the dopant concentration of the p-type dopant in the first epitaxial layer 236 is greater than about $4\times10^{20}$ atoms/cm$^3$, p-type dopant in the lattice interstices may also cause too much defect at the interface between the first epitaxial layer 236 and the channel layers 208, which may lead to increased resistance.

In the embodiments illustrated in FIG. 12A, the first epitaxial layer 236 may include a first substrate portion 236B disposed on the substrate 202 and first channel sidewall portions 236T in contact with the rounded ends of channel layers 208. The first channel sidewall portions 236T wraps over the rounded ends and has a curved shape. In these embodiments, the first channel sidewall portions 236T are formed to a thickness such that the rounded ends are completely covered. In some instances, each of the first channel sidewall portions 236T has a thickness between about 4 nm and about 6 nm along the X direction. The first substrate portion 236B does not coalesce or merge with first channel sidewall portions 236T. As such, each of the inner spacer features 234 is not completely covered by the first epitaxial layer 236. That is, while the inner spacer features 234 may come in contact with the first epitaxial layer 236, at least a portion of each of the inner spacer features 234 remain exposed. As measured from a bottom surface of the source/drain trench 228, the first substrate portion 236B has a first height (H1) along the Z direction. The first height (H1) is between about 12 nm and about 15 nm. As shown in FIG. 12A, because the first height (H1) is greater the depth D of the source/drain trench 228 into the substrate 202, a portion of the first substrate portion 236B rises above the substrate 202.

An Alternative embodiment of the first epitaxial layer 236 is illustrated in FIG. 12B. For clarity and ease of reference, the first epitaxial layer 236 in the alternative embodiment may be referred to the alternative first epitaxial layer 2360. As shown in FIG. 12B, the alternative first epitaxial layer 2360 may include a second substrate portion 2360B disposed on the substrate 202 and second channel sidewall portions 2360T in contact with the rounded ends of channel layers 208. The second channel sidewall portions 2360T wraps over the rounded ends and has a curved shape. In these embodiments, while the second channel sidewall portions 2360T are formed to a thickness to completely cover the rounded ends of the channel layers 208, the larger area of the exposed substrate 202 cause faster epitaxial growth of the second substrate portion 2360B. As a result, the second substrate portion 2360B merges with the second channel sidewall portions 2360T in contact with the bottommost channel layer 208. As illustrated in FIG. 12B, the second substrate portion 2360B is not only in contact with the substrate 202 but also in contact with the rounded ends of the bottommost channel layer 208. By extending between the substrate 202 and the bottommost channel layer 208, the second substrate portion 2360B also completely covers the bottommost inner spacer features 234. The bottommost inner spacer features 234 are those that are vertically (along the Z direction) sandwiched between the bottommost channel layer 208 and the substrate 202. Except for the bottommost inner spacer features 234, the alternative first epitaxial layer 2360 does not completely cover the other inner spacer features 234. In some instances, each of the second channel sidewall portions 2360T has a thickness between about 4 nm and about 6 nm along the X direction. As measured from a bottom surface of the source/drain trench 228, the second substrate portion 2360B has a second height (H2) along the Z direction. The second height (H2) is greater than the first height (H1) and is between about 15 nm and about 20 nm. As shown in FIG. 12B, because the second height (H2) is greater the depth D of the source/drain trench 228 into the substrate 202, a portion of the second substrate portion 2360B rises above the substrate 202.

Figure 13A:
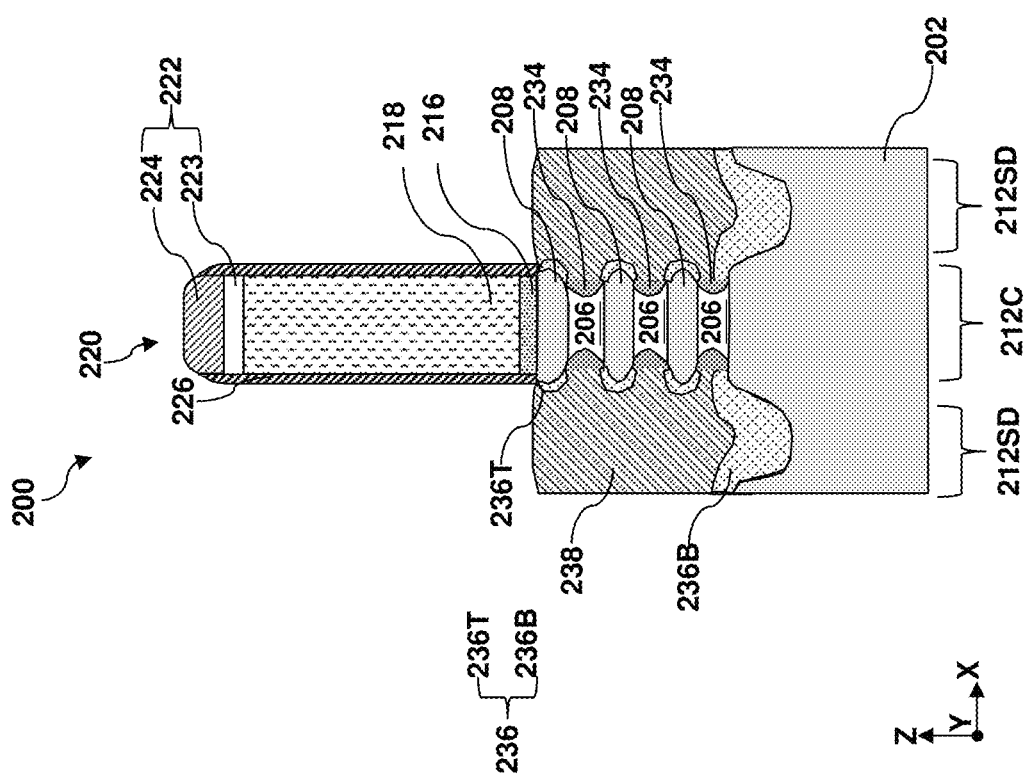
Figure 13B:
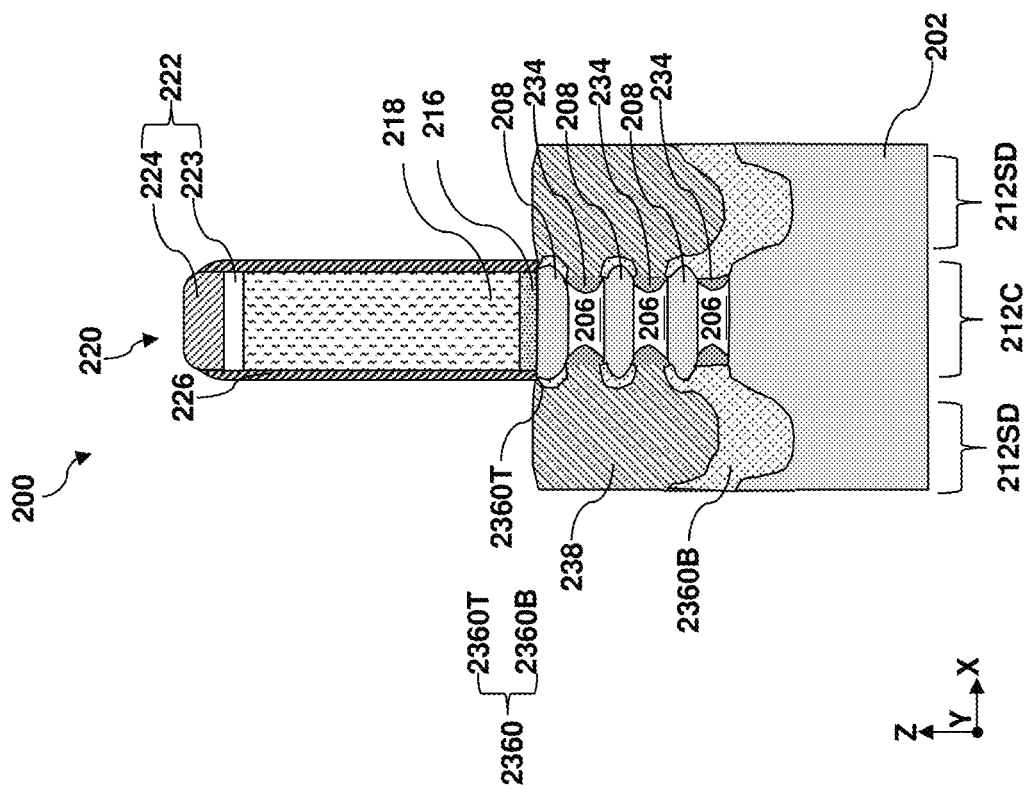

Referring to FIGS. 1, 13A and 13B, method 100 includes a block 118 where a second epitaxial layer 238 is deposited over the first epitaxial layer 236 in FIG. 13A or the alternative first epitaxial layer 2360 in FIG. 13B. In some embodiments, the second epitaxial layer 238 may be epitaxially and selectively formed from the first epitaxial layer 236 (or the alternative first epitaxial layer 2360). Suitable epitaxial processes for block 118 include vapor-phase epitaxy (VPE), ultra-high vacuum CVD (UHV-CVD), molecular beam epitaxy (MBE), and/or other suitable processes. The epitaxial growth process at block 118 may use gaseous precursors, which interact with the composition of the first epitaxial layer 236 (or the alternative first epitaxial layer 2360). The second epitaxial layer 238 is allowed to overgrow and merge over the inner spacer features 234 and substantially fill the source/drain trenches 228. In some embodiments, the second epitaxial layer 238 includes silicon germanium (SiGe) doped with a p-type dopant, such as boron (B). The second epitaxial layer 238 serves as a low resistance layer and includes a doping concentration greater than that in the first epitaxial layer 236 (or the alternative first epitaxial layer 2360). In some instances, the doping concentration in the second epitaxial layer 238 may be between about $4\times10^{20}$ atoms/cm$^3$ and about $2\times10^{21}$ atoms/cm$^3$. When the doping concentration of the p-type dopant in the second epitaxial layer 238 is lower than $4\times10^{20}$ atoms/cm$^3$, the second epitaxial layer 238 may not be sufficiently conductive to achieve satisfactory drive current (i.e., On-state current). Moreover, solubility of the p-type dopant in the second epitaxial layer 238 may prevent the doping concentration of the p-type dopant to exceed $2\times10^{21}$ atoms/cm$^3$. The doping concentration in the second epitaxial layer 238 is capped by the solubility of boron (B) in the second epitaxial layer 238. Compared to the first epitaxial layer 236 (or the alternative first epitaxial layer 2360), the second epitaxial layer 238 includes a greater germanium content to enhance the strain on the channel layers 208. In some implementations, the second epitaxial layer 238 includes a germanium content between about 50% and about 60% and a silicon content between about 40% and about 50%. According to the present disclosure, a volume of the second epitaxial layer 238 is greater than a volume of the first epitaxial layer 236 (or the alternative first epitaxial layer 2360). In this regard, the second epitaxial layer 238 is thicker than the first epitaxial layer 236 (or the alternative first epitaxial layer 2360). In some embodiments, the second epitaxial layer 238 may have a thickness between about 11 nm and about 15 nm, measured along the X direction. In some embodiments represented in FIGS. 13A and 13B, the second epitaxial layer 238 is separated or spaced apart from the channel layers 208 and the substrate 202 by the first epitaxial layer 236 (or the alternative first epitaxial layer 2360). The second epitaxial layer 238 may also be referred to as a second epitaxial feature. In the alternative embodiments illustrated in FIG. 13B, because the bottommost inner spacer features 234 are covered by the second substrate portion 2360B of the alternative first epitaxial layer 2360, the second epitaxial layer 238 is spaced apart from the bottommost inner spacer features 234. In FIG. 13B, the second epitaxial layer 238 is in contact with the other inner spacer features 234.

Figure 14A:
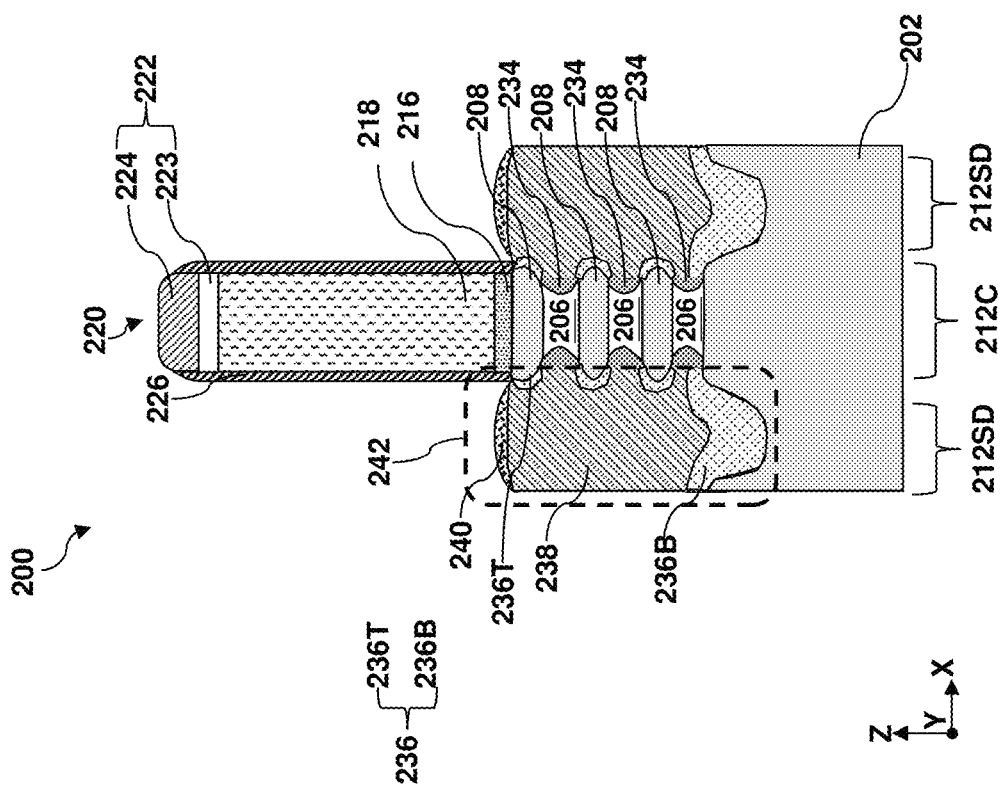
Figure 14B:
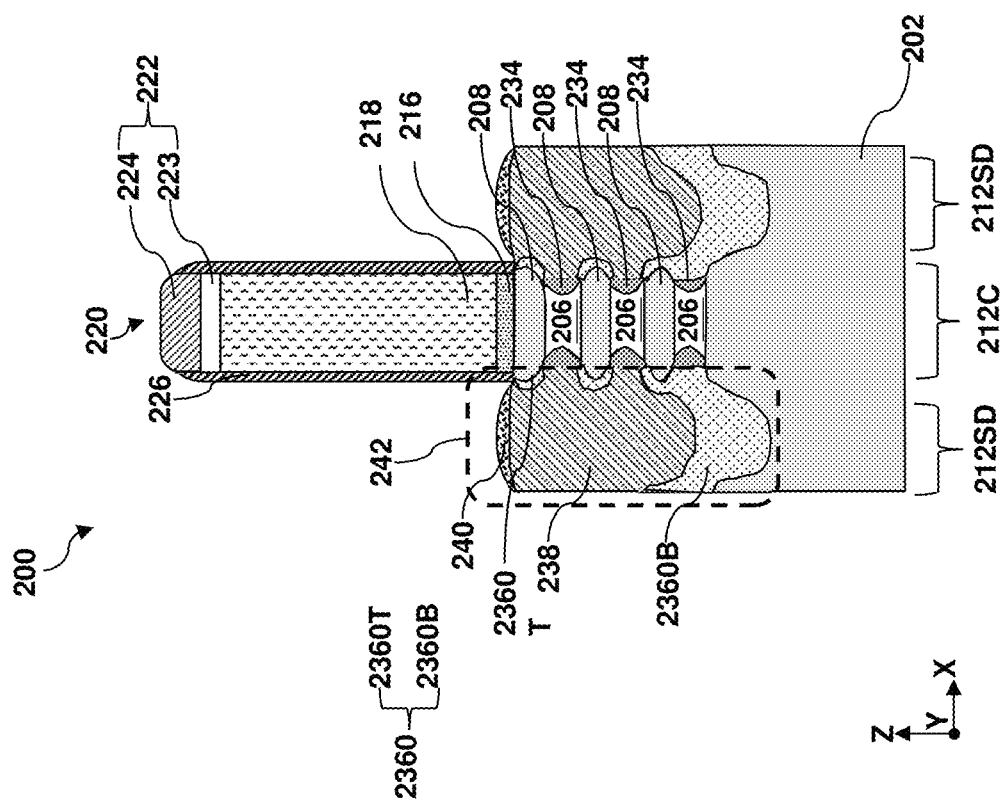

Referring to FIGS. 1, 14A and 14B, method 100 may optionally include a block 120 where a third epitaxial layer 240 is deposited on the second epitaxial layer 238. In some embodiments, the third epitaxial layer 240 may be epitaxially and selectively formed from the second epitaxial layer 238. Suitable epitaxial processes for block 120 include vapor-phase epitaxy (VPE), ultra-high vacuum CVD (UHV-CVD), molecular beam epitaxy (MBE), and/or other suitable processes. The epitaxial growth process at block 120 may use gaseous precursors, which interact with the composition of the second epitaxial layer 238. In some embodiments, the third epitaxial layer 240 includes silicon germanium (SiGe) and is doped with a p-type dopant, such as boron (B). The third epitaxial layer 240 functions as a sacrificial layer when a source/drain contact opening is formed. To better serve as the sacrificial layer, the third epitaxial layer 240 is made more etch-resistant by having a germanium content smaller than that of the second epitaxial layer 238 or even that of the first epitaxial layer 236 (or the alternative first epitaxial layer 2360). In some instances, the third epitaxial layer 240 has a germanium content between about 15% and about 20% and a silicon content between about 80% and about 85%. In the same vein, in order to increase etch resistance of the third epitaxial layer 240, a dopant concentration in the third epitaxial layer 240 is smaller than that of the second epitaxial layer 238. In some instances, the doping concentration in the third epitaxial layer 240 may be between about $2 \times 10^{20}$ atoms/cm$^3$ and about $6 \times 10^{20}$ atoms/cm$^3$. Along the Z direction, the third epitaxial layer 240 has a thickness between about 2 nm and about 3 nm. Referring to FIGS. 14A and 14B, the first epitaxial layer 236 (or the alternative first epitaxial layer 2360), the second epitaxial layer 238, and the third epitaxial layer 240 (if formed) in a source/drain region 212SD may be collectively referred to as a source/drain feature 242.

Figure 15A:
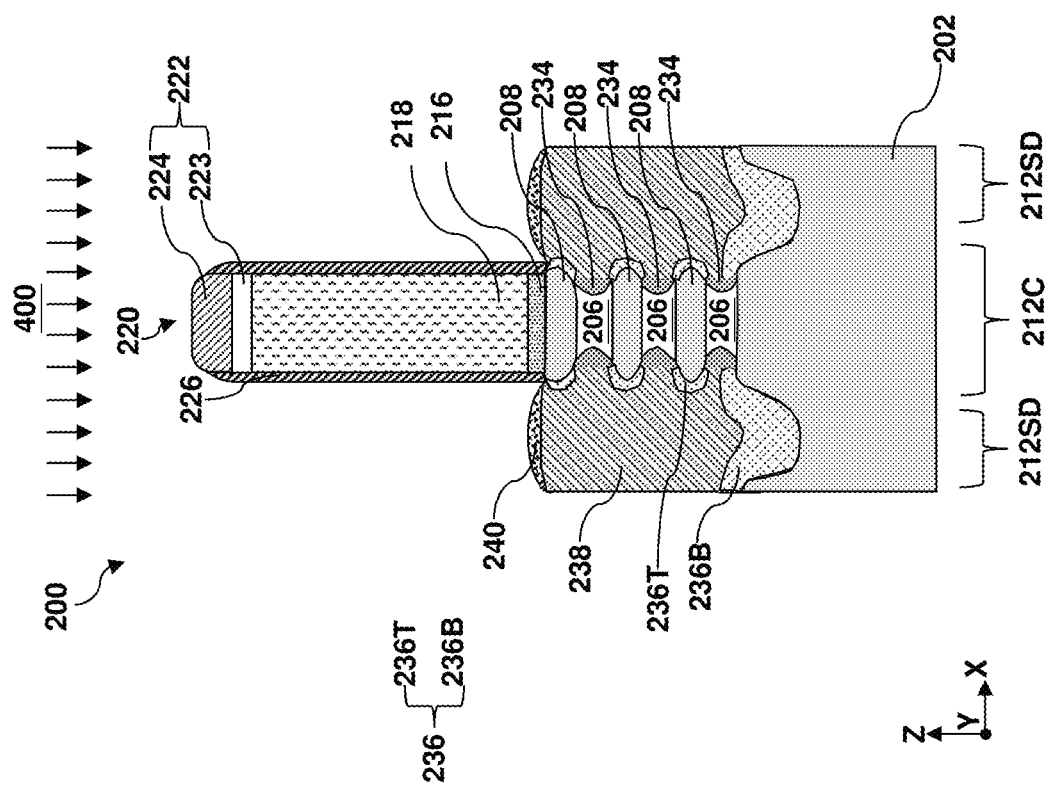
Figure 15B:
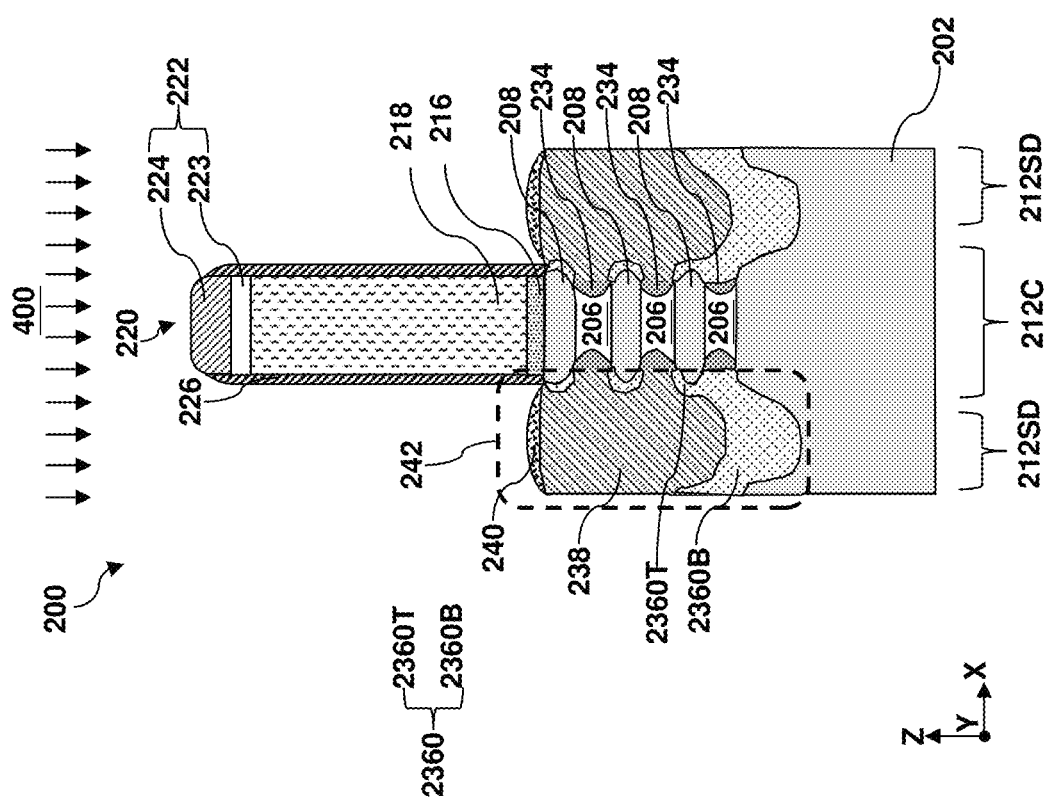

Referring to FIGS. 1, 15A and 15B, method 100 includes a block 122 where the workpiece 200 is annealed in an anneal process 400. In some implementation, the anneal process 400 may include a rapid thermal anneal (RTA) process, a laser spike anneal process, a flash anneal process, or a furnace anneal process. The anneal process 400 may include a peak anneal temperature between about 900° C. and about 1000° C. In these implementations, the peak anneal temperature may be maintained for a duration measured by seconds or microseconds. Through the anneal process 400, a desired electronic contribution of the p-type dopant in the semiconductor host, such as silicon germanium (SiGe) or germanium (Ge), may be obtained. The anneal process 400 may generate vacancies that facilitate movement of the p-type dopant from interstitial sites to substitutional lattice sites and reduce damages or defects in the lattice of the semiconductor host.

Figure 16B:
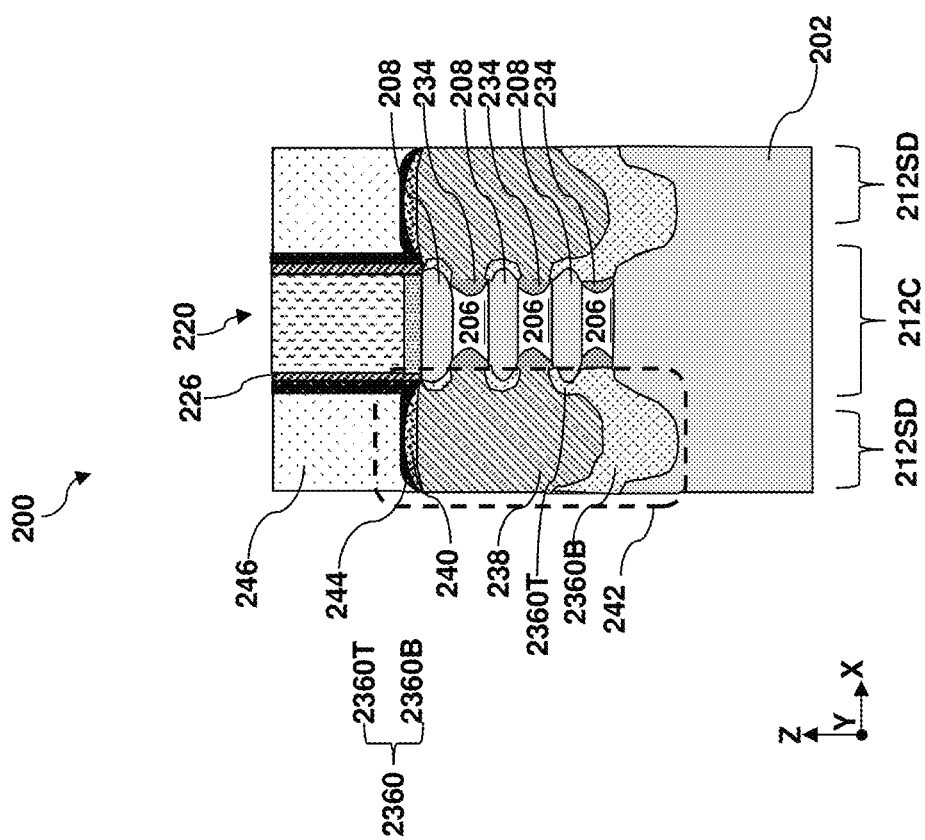
Figure 17A:
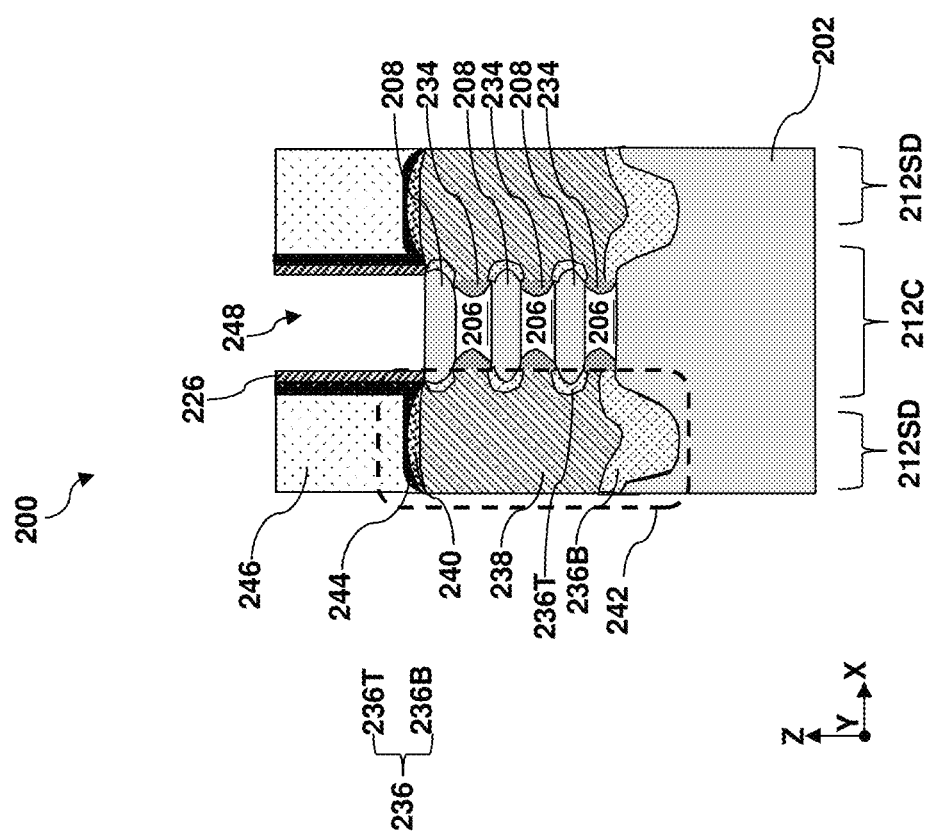
Figure 17B:
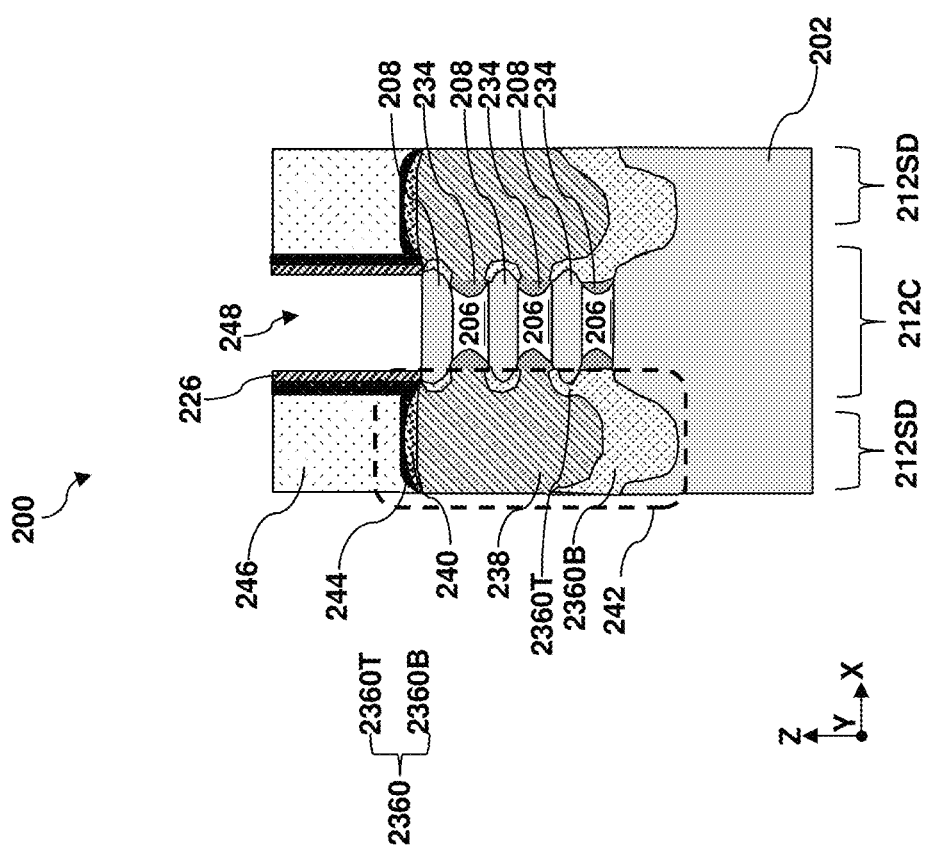
Figure 18A:
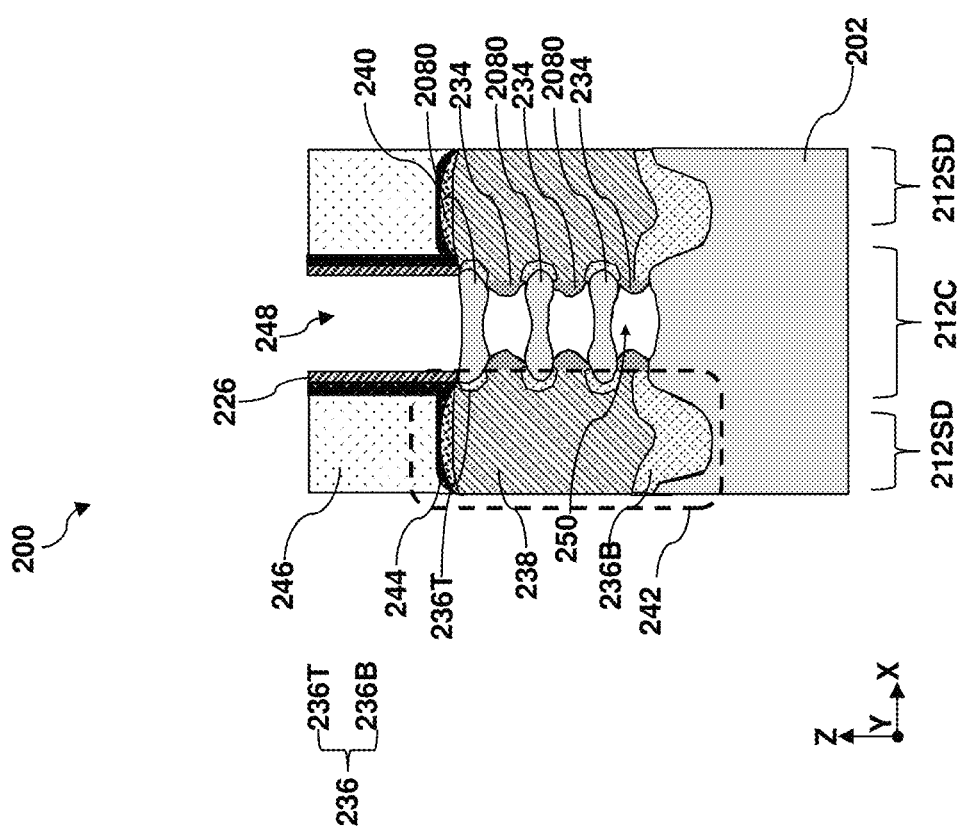
Figure 18B:
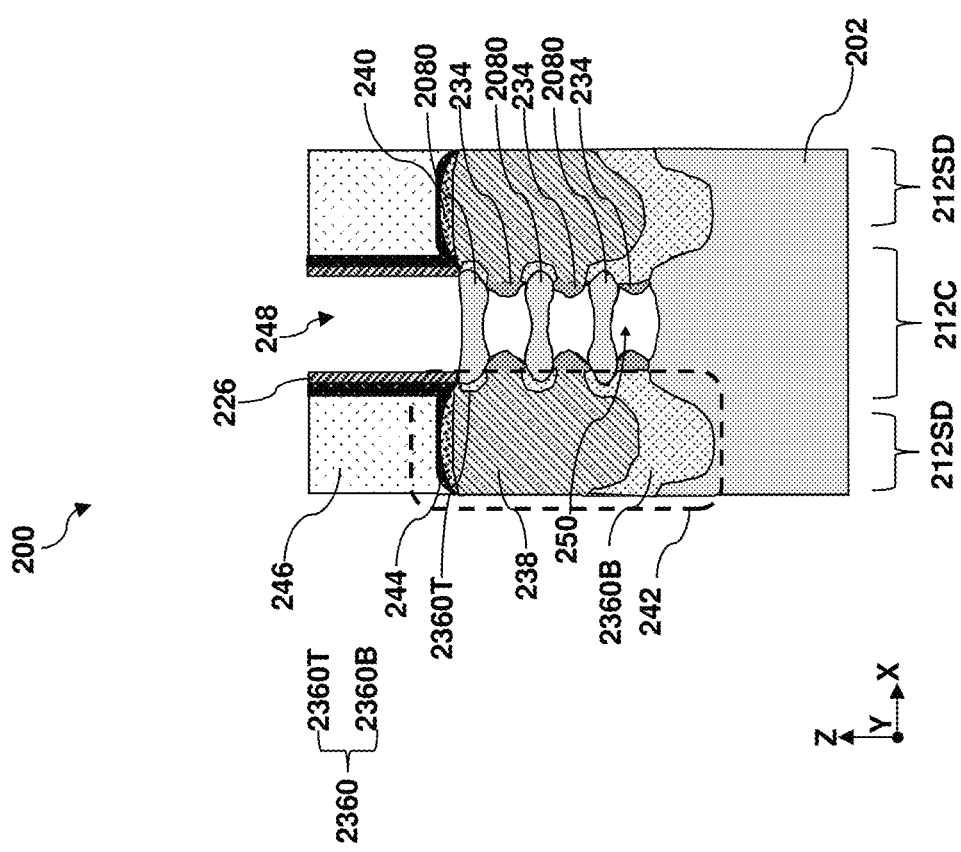

Referring to FIGS. 1, 16A-19A, and 16B-19B, method 100 includes a block 124 where further processes are performed. Such further processes may include, for example, deposition of a contact etch stop layer (CESL) 244 over the workpiece 200 (shown in FIGS. 16A and 16B), deposition of an interlayer dielectric (ILD) layer 246 over the CESL 244 (shown in FIGS. 16A and 16B), removal of the dummy gate stack 220 (shown in FIGS. 17A and 17B), selective removal of the sacrificial layers 206 in the channel region 212C to release the channel layers 208 as channel members 2080 (shown in FIGS. 18A and 18B), and formation of a gate structure 252 over the channel region 212C (shown in FIGS. 19A and 19B). Referring now to FIGS. 16A and 16B, the CESL 244 is formed prior to forming the ILD layer 246. In some examples, the CESL 244 includes silicon nitride, silicon oxynitride, and/or other materials known in the art. The CESL 244 may be formed by ALD, plasma-enhanced chemical vapor deposition (PECVD) process and/or other suitable deposition processes. The ILD layer 246 is then deposited over the CESL 244. In some embodiments, the ILD layer 246 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 246 may be deposited by a PECVD process or other suitable deposition technique. In some embodiments, after formation of the ILD layer 246, the workpiece 200 may be annealed to improve integrity of the ILD layer 246. As shown in FIGS. 16A, the CESL 244 may be disposed directly on top surfaces of the third epitaxial layer 240.

Referring still to FIGS. 16A and 16B, after the deposition of the CESL 244 and the ILD layer 246, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220 and release of the channel layers 208, illustrated in FIGS. 17A and 17B. In some embodiments, the removal of the dummy gate stack 220 results in a gate trench 248 over the channel regions 212C. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed in the gate trench 248.

Referring to FIGS. 17A, 17B, 18A, and 18B, after the removal of the dummy gate stack 220, the method 100 may include operations to selectively remove the sacrificial layers 206 between the channel layers 208 in the channel region 212C. The selective removal of the sacrificial layers 206 releases the channel layers 208 in FIGS. 17A and 17B to form channel members 2080 shown in FIGS. 18A and 18B. The selective removal of the sacrificial layers 206 also leaves behind space 250 between channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 19A:
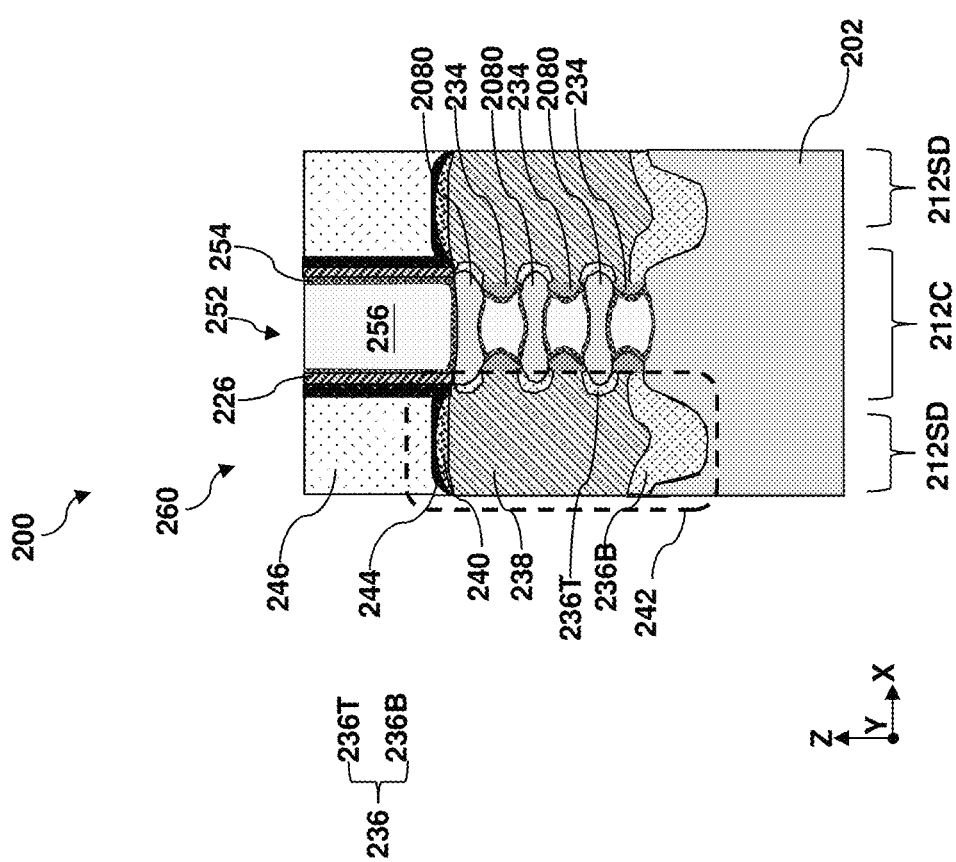
Figure 19B:
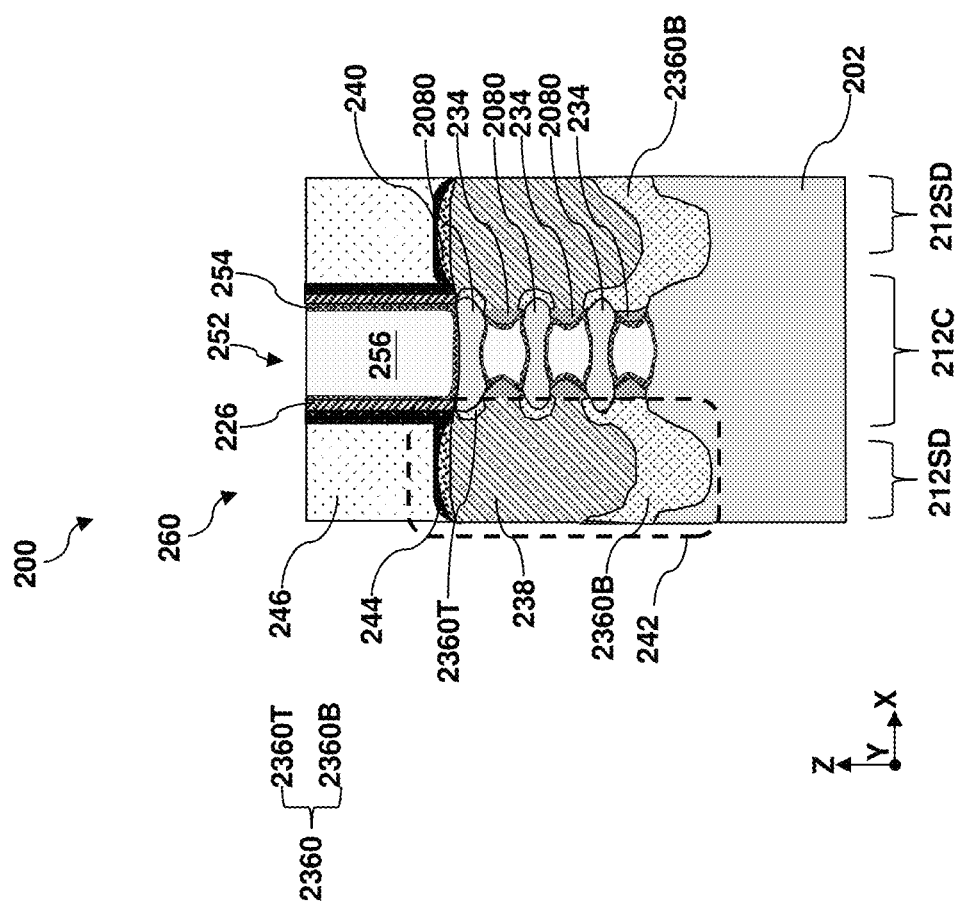

Referring to FIGS. 19A and 19B, the method 100 may include further operations to form the gate structure 252 to wrap around each of the channel members 2080. In some embodiments, the gate structure 252 is formed within the gate trench 248 and into the space 250 left behind by the removal of the sacrificial layers 206. In this regard, the gate structure 252 wraps around each of the channel members 2080. The gate structure 252 includes a gate dielectric layer 254 and a gate electrode layer 256 over the gate dielectric layer 254. In some embodiments, while not explicitly shown in the figures, the gate dielectric layer 254 includes an interfacial layer and a high-K gate dielectric layer. High-K dielectric materials, as used and described herein, include dielectric materials having a high dielectric constant, for example, greater than that of thermal silicon oxide (−3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer 256 of the gate structure 252 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 256 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a CMP process may be performed to remove excessive metal, thereby providing a substantially planar top surface of the gate structure 252. The gate structure 252 includes portions that interpose between channel members 2080 in the channel region 212C.

Reference is made to FIGS. 19A and 19B. Upon conclusion of the operations at block 124, a transistor 260 is substantially formed. The transistor 260 includes channel members 2080 that are vertically stacked along the Z direction. Each of the channel members 2080 is wrapped around by the gate structure 252. The channel members 2080 extend or are sandwiched between two source/drain features 242 along the X direction. Each of the source/drain features 242 includes the first epitaxial layer 236 (or the alternative first epitaxial layer 2360 shown in FIG. 19B) in contact with the substrate 202 and the channel members 2080, the second epitaxial layer 238 in contact with the first epitaxial layer 236, and the third epitaxial layer 240 (if formed). The second epitaxial layer 238 is spaced apart from the channel members 2080 by the first epitaxial layers 236 (or the alternative first epitaxial layer 2360).

Although not intended to be limiting, one or more embodiments of the present disclosure provide many benefits to a semiconductor device and the formation thereof. For example, embodiments of the present disclosure provide transistor that includes a vertical stack of the channel members extending between two source/drain features. Each of the source/drain features includes a first epitaxial layer, a second epitaxial layer over the first epitaxial layer, and a third epitaxial layer over the second epitaxial layer. The first epitaxial layer interfaces the channel members and serves as a transition layer between the channel members and the second epitaxial layers. The volume or thickness of the first epitaxial layer is just enough to cover the rounded ends of the channel layers. By minimizing the volume or thickness of the first epitaxial layer, the volume or thickness of the second epitaxial layer may be maximized. Compared to the first epitaxial layer, the second epitaxial layer has a greater germanium content to exert stress on the channel member and a greater dopant concentration to reduce resistance. The third epitaxial layer has a lower germanium content than the second epitaxial layer to serve as a sacrificial layer when a source/drain contact opening is formed. Embodiments of the present disclosure reduces parasitic resistance in the source/drain features.

In one exemplary aspect, the present disclosure is directed to a semiconductor device. The semiconductor device includes a plurality of channel members disposed over a substrate, a plurality of inner spacer features interleaving the plurality of channel members, a gate structure wrapping around each of the plurality of channel members, and a source/drain feature. The source/drain feature includes a first epitaxial layer in contact with the substrate and the plurality of channel members, and a second epitaxial layer in contact with the first epitaxial layer and the plurality of inner spacer features. The first epitaxial layer and the second epitaxial layer comprise silicon germanium. A germanium content of the second epitaxial layer is greater than a germanium content of the first epitaxial layer.

In some embodiments, the germanium content of the first epitaxial layer is between about 20% and about 30% and the germanium content of the second epitaxial layer is between about 50% and about 60%. In some implementations, the first epitaxial layer and the second epitaxial layer are doped with boron (B) and a boron doping concentration of the second epitaxial layer is greater than a boron doping concentration of the first epitaxial layer. In some instances, the semiconductor device may further include a third epitaxial layer disposed over the second epitaxial layer. The third epitaxial layer includes silicon germanium and a germanium content of the third epitaxial layer is smaller than the germanium content of the second epitaxial layer. In some embodiments, a germanium content of the third epitaxial layer is smaller than the germanium content of the first epitaxial layer. In some instances, the first epitaxial layer includes a substrate portion in contact with the substrate and the substrate portion completely covers a bottommost inner spacer feature of the plurality of inner spacer features. In some implementations, each of the plurality of channel members includes a rounded end. The substrate portion of the first epitaxial layer completely covers the rounded end of a bottommost channel member of the plurality of channel members. In some instances, with exception of the bottommost inner spacer feature, the plurality of inner spacer features are in contact with the second epitaxial layer.

In another exemplary aspect, the present disclosure is directed to a semiconductor device. The semiconductor device includes a plurality of silicon channel members disposed over a substrate, a plurality of dielectric inner spacer features interleaving the plurality of silicon channel members, each of the plurality of silicon channel members including a rounded end, a gate structure wrapping around each of the plurality of silicon channel members, and a source/drain feature. The source/drain feature includes a first epitaxial layer in contact with the substrate and rounded ends of the plurality of silicon channel members, and a second epitaxial layer in contact with the first epitaxial layer and the plurality of dielectric inner spacer features. The first epitaxial layer and the second epitaxial layer include silicon germanium. A germanium content of the first epitaxial layer is between about 20% and about 30% and a germanium content of the second epitaxial layer is between about 50% and about 60%.

In some embodiments, the first epitaxial layer and the second epitaxial layer are doped with boron (B) and a boron doping concentration of the second epitaxial layer is greater than a boron doping concentration of the first epitaxial layer. In some embodiments, the semiconductor device may further include a third epitaxial layer disposed over the second epitaxial layer. The third epitaxial layer includes silicon germanium and a germanium content of the third epitaxial layer between about 15% and about 20%. In some instances, the first epitaxial layer includes a substrate portion in contact with the substrate and a channel sidewall portion in contact with the plurality of silicon channel members and the substrate portion completely covers a bottommost dielectric inner spacer feature of the plurality of dielectric inner spacer features. In some implementations, the channel sidewall portion of the first epitaxial layer wraps over the rounded ends of the plurality of silicon channel members. In some embodiments, the channel sidewall portion of the first epitaxial layer includes a curved shape. In some instances, with exception of the bottommost dielectric inner spacer feature, the plurality of dielectric inner spacer features are in contact with the second epitaxial layer.

In yet another exemplary aspect, the present disclosure is directed to a method. The method includes forming a stack over a substrate, wherein the stack includes a plurality of silicon layers interleaved by a plurality of silicon germanium layers, forming a fin-shaped structure from the stack and the substrate, the fin-shaped structure comprising a channel region and a source/drain region, forming a dummy gate stack over the channel region of the fin-shaped structure, depositing a gate spacer layer over the dummy gate stack, recessing the source/drain region to form a source/drain trench that exposes sidewalls of the plurality of silicon layers and the plurality of silicon germanium layers, selectively and partially recessing the plurality of silicon germanium layers to form a plurality of inner spacer recesses, forming a plurality of inner spacer features in the plurality of inner spacer recesses, depositing a first epitaxial layer in the source/drain trench, the first epitaxial layer being in contact with the plurality of silicon layers, depositing a second epitaxial layer over the first epitaxial layer, the second epitaxial layer being in contact with the plurality of inner spacer features and the first epitaxial layer, depositing a third epitaxial layer on the second epitaxial layer, after the depositing of the third epitaxial layer, removing the dummy gate stack, releasing the plurality of silicon layers in the channel region as a plurality of channel members, and forming a gate structure around each of the plurality of channel members. The first epitaxial layer and the second epitaxial layer include silicon germanium and a germanium content of the second epitaxial layer is greater than a germanium content of the first epitaxial layer.

In some embodiments, the method may further include after the forming of the plurality of inner spacer features and before the depositing of the first epitaxial layer, performing a cleaning process to trim the plurality of silicon layers. In some embodiments, the germanium content of the first epitaxial layer is between about 20% and about 30% and the germanium content of the second epitaxial layer is between about 50% and about 60%. In some implementations, the third epitaxial layer includes silicon germanium and a germanium content of the third epitaxial layer is smaller than the germanium content of the second epitaxial layer. In some instances, the first epitaxial layer includes a substrate portion in contact with the substrate and the substrate portion completely covers a bottommost inner spacer feature of the plurality of inner spacer features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of channel members disposed over a substrate and extending lengthwise along a first direction, each of the plurality of channel members comprising a rounded end when viewed along a second direction perpendicular to the first direction;
a plurality of inner spacer features interleaving the plurality of channel members;
a gate structure wrapping around each of the plurality of channel members;
a source/drain feature comprising:
a first epitaxial layer in contact with the substrate and the rounded ends of the plurality of channel members,
a second epitaxial layer in contact with the first epitaxial layer and at least one of the plurality of inner spacer features, and
a third epitaxial layer disposed over the second epitaxial layer; and
a dielectric etch stop layer disposed over and interfacing the third epitaxial layer,
wherein the plurality of channel members and the rounded ends of the plurality of channel members share a same composition,
wherein the first epitaxial layer, the second epitaxial layer and the third epitaxial layer comprise silicon germanium,
wherein a germanium content of the second epitaxial layer is greater than a germanium content of the first epitaxial layer,
wherein the second epitaxial layer and the third epitaxial layer are doped with boron (B),
wherein a boron doping concentration of the second epitaxial layer is greater than a boron doping concentration of the third epitaxial layer.

2. The semiconductor device of claim 1,
wherein the germanium content of the first epitaxial layer is between about 20% and about 30%,
wherein the germanium content of the second epitaxial layer is between about 50% and about 60%.

3. The semiconductor device of claim 1,
wherein the first epitaxial layer is doped with boron (B),
wherein the boron doping concentration of the second epitaxial layer is greater than a boron doping concentration of the first epitaxial layer.

4. The semiconductor device of claim 1,
wherein the third epitaxial layer comprises silicon germanium,
wherein a germanium content of the third epitaxial layer is smaller than the germanium content of the second epitaxial layer.

5. The semiconductor device of claim 4, wherein a germanium content of the third epitaxial layer is smaller than the germanium content of the first epitaxial layer.

6. The semiconductor device of claim 1,
wherein the first epitaxial layer comprises a substrate portion in contact with the substrate,
wherein the substrate portion completely covers and is in direct contact with a bottommost inner spacer feature of the plurality of inner spacer features.

7. The semiconductor device of claim 6,
wherein the plurality of channel members interface a sidewall of the source/drain feature along the first direction,
wherein the plurality of channel members and rounded ends of the plurality of channel members comprise silicon and are substantially dopant-free.

8. The semiconductor device of claim 6, wherein, with exception of the bottommost inner spacer feature, the plurality of inner spacer features are in contact with the second epitaxial layer.

9. A semiconductor device, comprising:
a plurality of silicon channel members disposed over a substrate and extending lengthwise along a first direction, each of the plurality of silicon channel members including a rounded end when viewed along a second direction perpendicular to the first direction;
a plurality of dielectric inner spacer features interleaving the plurality of silicon channel members;
a gate structure wrapping around each of the plurality of silicon channel members;
a source/drain feature comprising:
a first epitaxial layer in contact with the substrate and the rounded ends of the plurality of silicon channel members,
a second epitaxial layer in contact with the first epitaxial layer and the plurality of dielectric inner spacer features, and
a third epitaxial layer disposed over the second epitaxial layer; and
a dielectric etch stop layer disposed over and interfacing a top surface of the third epitaxial layer,
wherein the rounded ends of the plurality of silicon channel members comprise silicon and are substantially dopant free,
wherein the first epitaxial layer and the second epitaxial layer comprise silicon germanium,
wherein a germanium content of the first epitaxial layer is between about 20% and about 30%,
wherein a germanium content of the second epitaxial layer is between about 50% and about 60%,
wherein the second epitaxial layer and the third epitaxial layer are doped with boron (B),
wherein a boron doping concentration of the second epitaxial layer is greater than a boron doping concentration of the third epitaxial layer.

10. The semiconductor device of claim 9,
wherein the first epitaxial layer is doped with boron (B),
wherein the boron doping concentration of the second epitaxial layer is greater than a boron doping concentration of the first epitaxial layer.

11. The semiconductor device of claim 9,
wherein the third epitaxial layer comprises silicon germanium,
wherein a bottom surface of the third epitaxial layer is higher than a topmost one of the plurality of silicon channel members,
wherein a germanium content of the third epitaxial layer between about 15% and about 20%.

12. The semiconductor device of claim 9,
wherein the first epitaxial layer comprises a substrate portion in contact with the substrate and a channel sidewall portion in contact with the plurality of silicon channel members,
wherein the substrate portion completely covers a bottommost dielectric inner spacer feature of the plurality of dielectric inner spacer features.

13. The semiconductor device of claim 12,
wherein the channel sidewall portion of the first epitaxial layer wraps over the rounded ends of the plurality of silicon channel members.

14. The semiconductor device of claim 12,
wherein the channel sidewall portion of the first epitaxial layer comprises a curved shape.

15. The semiconductor device of claim 12, wherein, with exception of the bottommost dielectric inner spacer feature, the plurality of dielectric inner spacer features are in contact with the second epitaxial layer.

16. A semiconductor device, comprising:
a first source/drain feature and a second source/drain feature disposed over a substrate;
a dielectric etch stop layer disposed over the first source/drain feature and the second source/drain feature;
a plurality of nanostructures disposed over the substrate and extending between the first source/drain feature and the second source/drain feature along a direction; and
a gate structure wrapping around each of the plurality of nanostructures,
wherein each of the first source/drain feature and the second source/drain feature includes a first epitaxial layer, a second epitaxial layer, and a third epitaxial layer disposed on the second epitaxial layer,
wherein each of the plurality of nanostructures extends lengthwise along a first direction and comprises a curved end when viewed along a second direction perpendicular to the first direction,
wherein the first epitaxial layer is contact with the substrate and wraps over curved ends of the plurality of nanostructures,
wherein the curved ends of the plurality of nanostructures and the plurality of nanostructures share a same composition,
wherein the second epitaxial layer is spaced apart from the curved ends of the plurality of nanostructures and the substrate by the first epitaxial layer,
wherein a top surface of the third epitaxial layer directly interfaces the dielectric etch stop layer, wherein the third epitaxial layer comprises silicon germanium, wherein the second epitaxial layer and the third epitaxial layer are doped with boron (B), wherein a boron doping concentration of the second epitaxial layer is greater than a boron doping concentration of the third epitaxial layer.

17. The semiconductor device of claim 16, wherein the top surface of the third epitaxial layer is curved, wherein the first epitaxial layer and the second epitaxial layer comprise silicon germanium, wherein a germanium content of the second epitaxial layer is greater than a germanium content of the first epitaxial layer.

18. The semiconductor device of claim 16, wherein the first epitaxial layer is doped with boron (B), wherein the boron doping concentration of the second epitaxial layer is greater than a boron doping concentration of the first epitaxial layer.

19. The semiconductor device of claim 16, further comprising:

a plurality of inner spacer features interleaving the plurality of nanostructures, wherein the gate structure is spaced apart from the first source/drain feature by the plurality of inner spacer features.

20. The semiconductor device of claim 19, wherein the first epitaxial layer comprises a substrate portion in contact with the substrate and a channel sidewall portion in contact with the plurality of nanostructures, wherein the substrate portion completely covers and is in contact with a sidewall of a bottommost inner spacer feature of the plurality of inner spacer features.

* * * * *